(12) United States Patent
Sato et al.

(10) Patent No.: US 12,244,287 B2
(45) Date of Patent: Mar. 4, 2025

(54) FILTER DEVICE AND MULTIPLEXER

(71) Applicant: Murata Manufacturing Co., Ltd., Nagaokakyo (JP)

(72) Inventors: Takuya Sato, Nagaokakyo (JP); Masahiro Teramoto, Nagaokakyo (JP); Keisuke Ogawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 242 days.

(21) Appl. No.: 17/981,600

(22) Filed: Nov. 7, 2022

(65) Prior Publication Data

US 2023/0077950 A1 Mar. 16, 2023

Related U.S. Application Data

(63) Continuation of application No. PCT/JP2021/021022, filed on Jun. 2, 2021.

(30) Foreign Application Priority Data

Jul. 1, 2020 (JP) .................................. 2020-114051

(51) Int. Cl.
  *H03H 7/42* (2006.01)
  *H03H 7/01* (2006.01)
  *H03K 19/173* (2006.01)

(52) U.S. Cl.
  CPC ............ *H03H 7/42* (2013.01); *H03H 7/1783* (2013.01); *H03K 19/1737* (2013.01)

(58) Field of Classification Search
  CPC ............ H03H 2001/0085; H03H 7/09; H03H 7/0115; H03H 7/1775; H03H 7/42;
  (Continued)

(56) References Cited

U.S. PATENT DOCUMENTS

2007/0176712 A1    8/2007  Tomaki et al.
2011/0140806 A1*  6/2011  Taniguchi ................ H03H 7/09
                                                 333/185

(Continued)

FOREIGN PATENT DOCUMENTS

JP     2007208395 A    8/2007
JP     2011124880 A    6/2011

(Continued)

OTHER PUBLICATIONS

International Search Report in PCT/JP2021/021022, mailed Aug. 17, 2021, 3 pages.

(Continued)

*Primary Examiner* — Lincoln D Donovan
*Assistant Examiner* — Tyler J Pereny
(74) *Attorney, Agent, or Firm* — Keating & Bennett, LLP

(57) ABSTRACT

A filter device includes an unbalanced terminal, balanced terminals, and first and second resonant circuits. The first resonant circuit is connected to the unbalanced terminal. The second resonant circuit is connected to the balanced terminals and electromagnetically coupled with the first resonant circuit. The first resonant circuit includes a resonator in which an inductor and a capacitor are connected in parallel between the unbalanced terminal and a reference potential. The second resonant circuit includes a resonator including an inductor connected between the balanced terminals and capacitors connected in series between the balanced terminals.

16 Claims, 14 Drawing Sheets

(58) Field of Classification Search
CPC .... H03H 7/1708; H03H 7/422; H03H 7/0123; H03H 7/0161; H03H 7/1758; H03H 7/463; H01F 27/00; H01F 17/00; H01F 2017/0026; H01F 2027/2809; H01F 27/2804; H01P 5/10; H01P 1/20345; H01P 1/203; H01G 4/40; H01G 4/30
See application file for complete search history.

(56) References Cited

U.S. PATENT DOCUMENTS

| | | | |
|---|---|---|---|
| 2012/0098622 A1 | 4/2012 | Taniguchi | |
| 2012/0119852 A1 | 5/2012 | Sasaki et al. | |
| 2020/0028493 A1* | 1/2020 | Ta | H03H 9/542 |

FOREIGN PATENT DOCUMENTS

| | | | |
|---|---|---|---|
| JP | 2011147090 A | 7/2011 |
| JP | 2012109949 A | 6/2012 |
| JP | 2012120149 A | 6/2012 |

OTHER PUBLICATIONS

Written Opinion in PCT/JP2021/021022, mailed Aug. 17, 2021, 4 pages.

\* cited by examiner

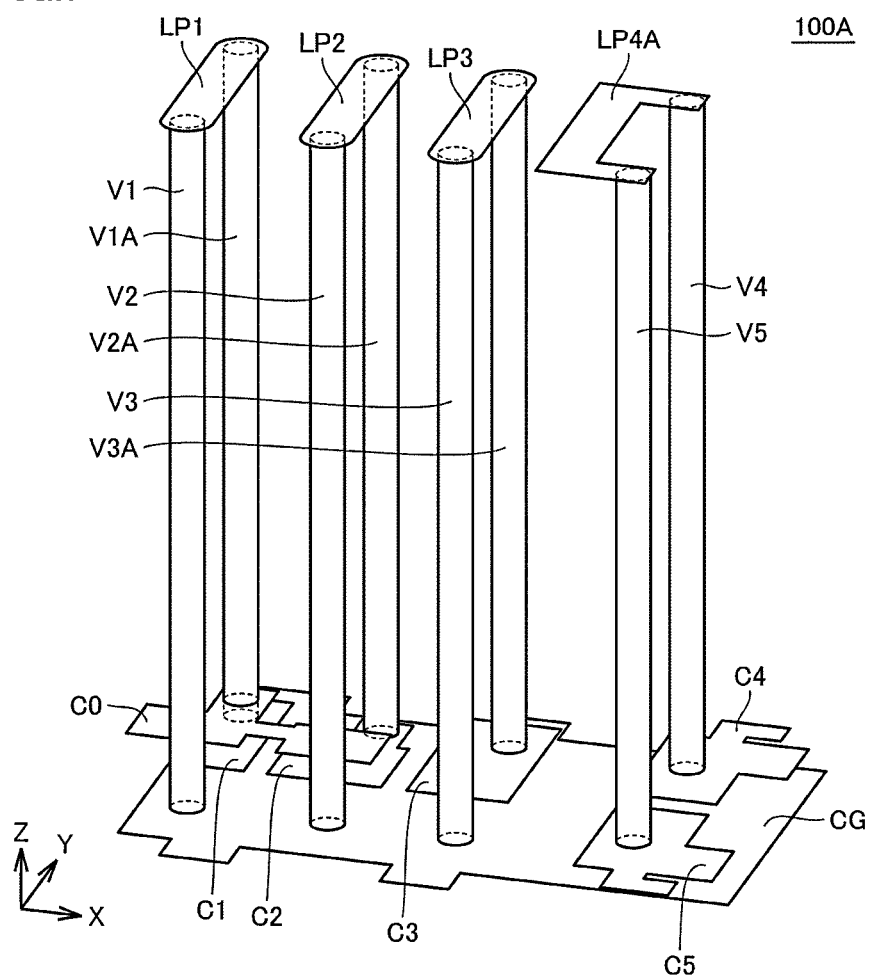

FILTER DEVICE AND MULTIPLEXER

CROSS REFERENCE TO RELATED APPLICATIONS

This application claims the benefit of priority to Japanese Patent Application No. 2020-114051 filed on Jul. 1, 2020 and is a Continuation Application of PCT Application No. PCT/JP2021/021022 filed on Jun. 2, 2021. The entire contents of each application are hereby incorporated herein by reference.

BACKGROUND OF THE INVENTION

1. Field of the Invention

The present disclosure relates to filter devices and multiplexers and, more specifically, to technology for reducing the size of a multilayer filter device.

2. Description of the Related Art

For interconversion between unbalanced signals and balanced signals, a balanced filter (balun) is used. The balanced signals are paired signals that are equal in amplitude and have their phases inverted, and are generally used for a differential amplifier circuit in an IC in a communication system, and so forth. On the other hand, the unbalanced signals are signals used for a transmission scheme of transmitting potential changes with respect to the ground potential, and correspond to input/output signals on a microstrip line or antenna.

There is a balanced filter with a structure in which a resonator connected to an unbalanced terminal and a resonator connected to a balanced terminal are electromagnetically coupled to transmit signals. Several structures of the balanced filter as described above are disclosed in Japanese Unexamined Patent Application Publication No. 2012-109949, Japanese Unexamined Patent Application Publication No. 2007-208395, and Japanese Unexamined Patent Application Publication No. 2012-120149.

As a resonator for use in a balanced filter, a structure in which a balanced terminal or unbalanced terminal connected to the resonator is connected to a reference potential via an inductor (hereinafter also referred to as a "short-circuited resonator") and a structure in which a balanced terminal or unbalanced terminal is connected to a reference potential via a capacitor (hereinafter also referred to as an "open-type resonator") are adopted. When a wavelength of a signal to be transmitted is $\lambda$, in general, the line length is set at $\lambda/4$ in the short-circuited resonator and the line length is set at $\lambda/2$ in the open-type resonator.

In the above-described balanced filter of Japanese Unexamined Patent Application Publication No. 2012-109949, both resonators on an unbalanced terminal side and a balanced terminal side are formed of short-circuited resonators. On the other hand, in Japanese Unexamined Patent Application Publication No. 2007-208395 and Japanese Unexamined Patent Application Publication No. 2012-120149, both resonators are formed of open-type resonators.

In the open-type resonator, since the required line length is $\lambda/2$ (half wavelength), in particular, when the resonator is used as one on the balanced terminal side, a phase difference of 180° can be easily achieved. Thus, excellent balance characteristics can be advantageously obtained. Also, it has been known that, in general, a higher Q factor can be obtained in the open-type resonator than that in the short-circuited resonator, and this is advantageous in bandpass characteristics and attenuation characteristics.

On the other hand, in the short-circuited resonator, the required line length is shorter compared with the open-type resonator. Thus, this is advantageous in reducing the size of the entire filter.

The balanced filter may be used in a portable terminal typified by a cellular phone or smartphone. In these communication devices, with an improvement in communication quality, needs for a further reduction in size and thickness are high and, accordingly, a reduction in size and profile of components such as the balanced filter is also desired.

SUMMARY OF THE INVENTION

Preferred embodiments of the present invention reduce or prevent a degradation in filter characteristics and also achieve a reduction in size of a balanced filter.

A filter device according to a preferred embodiment of the present disclosure includes an unbalanced terminal, a first balanced terminal, a second balanced terminal, a first resonant circuit, and a second resonant circuit. The first resonant circuit is connected to the unbalanced terminal. The second resonant circuit is connected to the first balanced terminal and the second balanced terminal and electromagnetically coupled with the first resonant circuit. The first resonant circuit includes a first resonator in which a first inductor and a first capacitor are connected in parallel between the unbalanced terminal and a reference potential. The second resonant circuit includes a second resonator including a second inductor connected between the first balanced terminal and the second balanced terminal and a second capacitor and a third capacitor connected in series between the first balanced terminal and the second balanced terminal.

In a filter device according to a preferred embodiment of the present disclosure, in a balanced filter which converts a signal between an unbalanced line and a balanced line, the first resonant circuit connected to the unbalanced terminal includes a short-circuited resonator in which one end of the inductor is directly connected to the reference potential. On the other hand, the second resonant circuit connected to the balanced terminals includes an open-type resonator in which a non-grounded inductor is connected to the two balanced terminals. By using an open-type resonator on a balanced line side (output side), favorable balance characteristics can be obtained. Also, by using a short-circuited resonator on sides other than the output side, a reduction in size can be achieved. Therefore, in the balanced filter, a reduction in size can be achieved while a degradation in filter characteristic is reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a diagram depicting the inner structure of a filter device of Modification 1 of a preferred embodiment of the present invention.

DETAILED DESCRIPTION OF THE PREFERRED EMBODIMENTS

Figure 1:
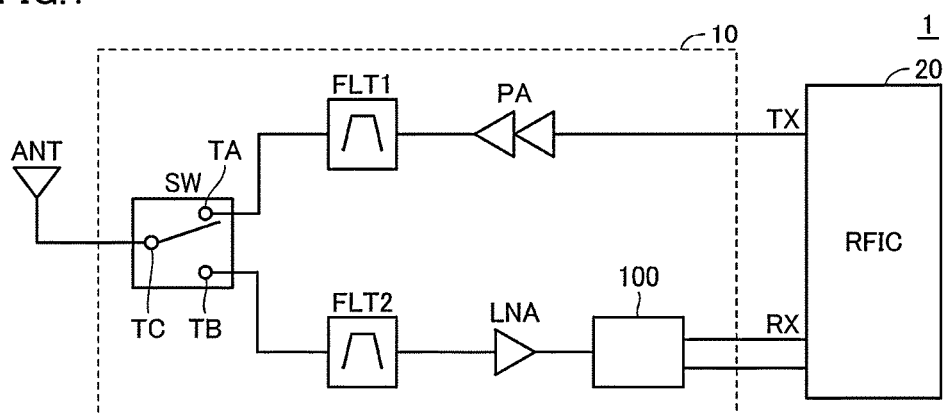
FIG. 1 is a block diagram of a communication device including a front-end circuit to which a filter device according to Preferred Embodiment 1 of the present invention is applied.

Preferred embodiments of the present disclosure are described in detail below with reference to the drawings. Note that the same or corresponding portions in the drawings are provided with the same reference character and their description is not repeated.

Preferred Embodiment 1

General Outline of Communication Device

FIG. 1 is a block diagram of a communication device 1 including a front-end circuit 10 to which a filter device 100 according to Preferred Embodiment 1 is applied. With reference to FIG. 1, the communication device 1 includes, in addition to the front-end circuit 10, an antenna ANT and a RFIC 20 as a signal processing circuit.

The RFIC 20 outputs a high frequency signal, which is a transmission signal, to a transmission-side line TX, and the outputted high frequency signal is radiated via the front-end circuit 10 from the antenna ANT as an electric wave. Also, the electric wave received at the antenna ANT is inputted as a high frequency signal, which is a reception signal, from a reception-side line RX to the RFIC 20, and the RFIC 20 processes the reception signal for transmission to the subsequent circuit.

The front-end circuit 10 includes, in addition to the filter device 100, a switch SW, filters FLT1 and FLT2, a power amplifier PA, and a low noise amplifier LNA. The switch SW is used to switch between transmission and reception of an electric wave at the antenna ANT. The switch SW includes a common terminal TC and two selection terminals TA and TB. The common terminal TC is connected to the antenna ANT. The selection terminal TA is connected to the transmission-side line TX via the filter FLT1 and the power amplifier PA. The selection terminal TB is connected to the reception-side line RX via the filter FLT2, the low noise amplifier LNA, and the filter device 100.

When an electric wave is radiated from the antenna ANT, the common terminal TC of the switch SW is connected to the selection terminal TA. On the other hand, when an electric wave is received at the antenna ANT, the common terminal TC of the switch SW is connected to the selection terminal TB.

The power amplifier PA amplifies a high frequency signal, which is a transmission signal transmitted from the RFIC 20, and outputs the signal to the filter FLT1. The filter FLT1 includes a low pass filter, a high pass filter, or a band pass filter, letting a signal of a desired frequency band in the high frequency signal amplified by the power amplifier PA pass. The high frequency signal passing through the filter FLT1 is radiated via the switch SW from the antenna ANT as an electric wave.

The filter FLT2 includes, as with the above-described filter FLT1, a low pass filter, a high pass filter, or a band pass filter, letting a signal of a desired frequency band in the high frequency signal, which is a reception signal received at the antenna ANT, pass. The high frequency signal passing through the filter FLT2 is amplified with low noise by the low noise amplifier LNA, and is transmitted to the filter device 100.

The filter device 100 is a balanced filter (balun) to convert unbalanced signals to balanced signals. The balanced signals are paired signals that are equal in amplitude and have their phases inverted, and the unbalanced signals are signals used for a transmission scheme of transmitting potential changes with respect to the ground potential. In general, a line connected to an antenna is an unbalanced line. On the other hand, in an IC circuit such as the RFIC 20, processing is performed with balanced signals. Thus, reception signals from the antenna ANT transmitted as unbalanced signals are converted, by using the filter device 100, into balanced signals suitable for processing in the RFIC 20.

Structure of Filter Device

Figure 2:
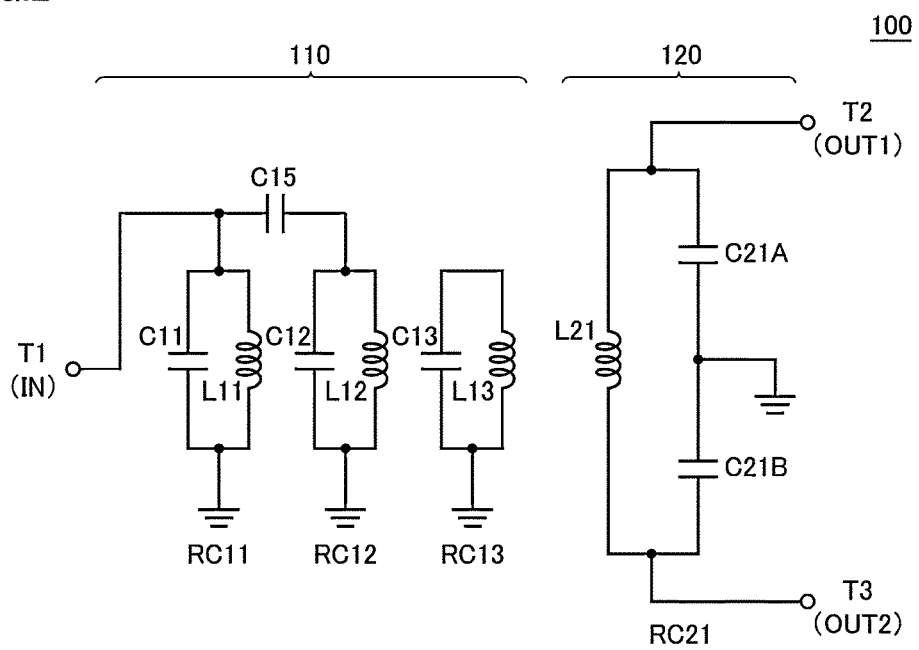
FIG. 2 is an equivalent circuit diagram of the filter device of FIG. 1.
Figure 3:
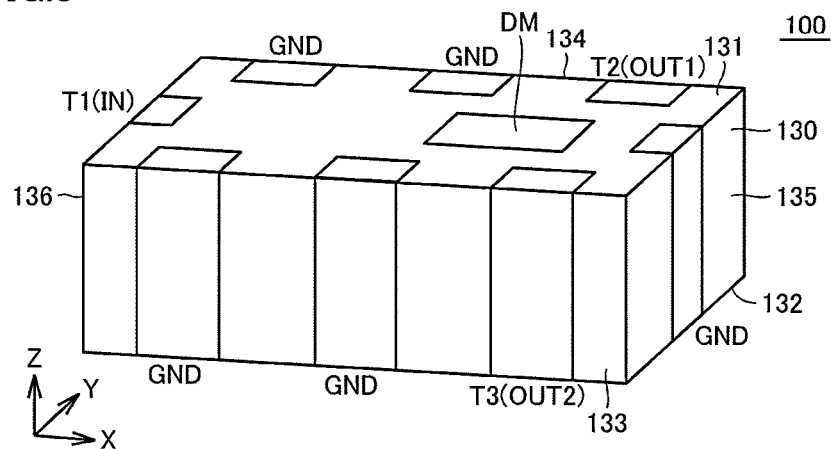
FIG. 3 is a perspective view of the outer shape of the filter device of FIG. 2.
Figure 4:
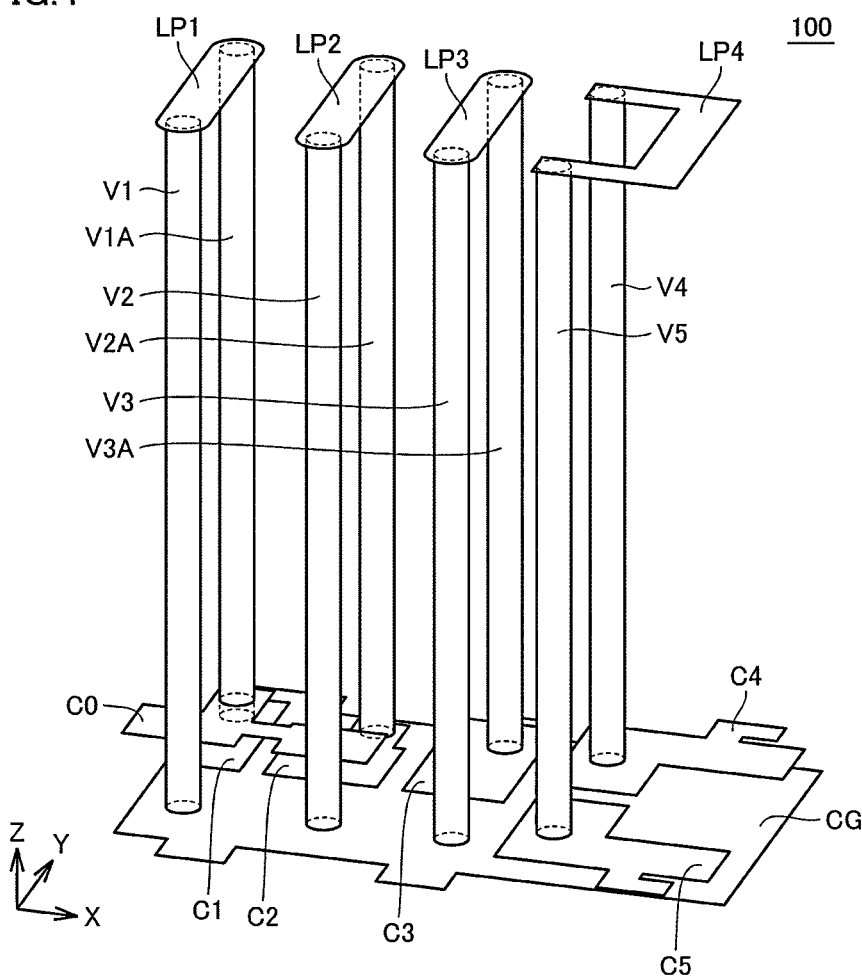
FIG. 4 is a diagram depicting the inner structure in FIG. 3 with a dielectric omitted.
Figure 5:
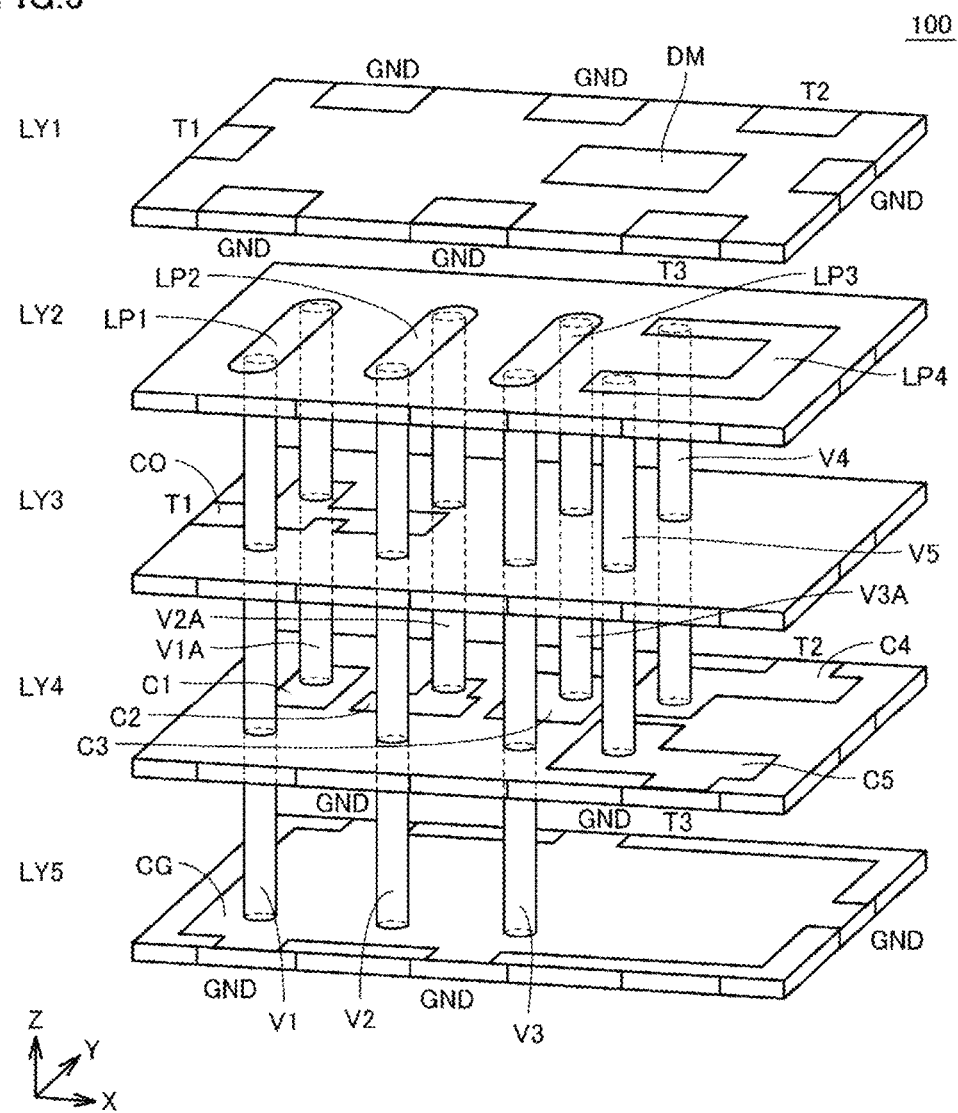
FIG. 5 is an exploded perspective view of the filter device of FIG. 3.

Next, details of the filter device 100 are described by using FIG. 2 to FIG. 5. FIG. 2 is an equivalent circuit diagram of the filter device 100 and FIG. 3 is a perspective view of the outer shape of the filter device 100. FIG. 4 is a diagram depicting the inner structure in FIG. 3 with a dielectric omitted. FIG. 5 is an exploded perspective view of the filter device 100. In FIG. 3 to FIG. 5, the direction of the normal to a dielectric layer (laminating direction) is taken as a Z-axis direction, and a plane perpendicular to the Z-axis direction is taken as an XY plane. Note that, in drawings of FIG. 4 and FIG. 7 to FIG. 12 described further below each depicting an inner structure, the scale in the laminating direction is partially exaggerated.

With reference to the equivalent circuit of FIG. 2, the filter device 100 includes an unbalanced terminal T1 on an input side, balanced terminals T2 and T3 on an output side, a resonant circuit 110 (first resonant circuit) connected to the unbalanced terminal T1, and a resonant circuit 120 (second resonant circuit) connected to the balanced terminals T2 and T3. The resonant circuits 110 and 120 are each configured to include at least one LC parallel resonator. In the example of FIG. 2, the resonant circuit 110 includes three resonators RC11, RC12, and RC13, and the resonant circuit 120 includes one resonator RC21.

Each of the resonators RC11, RC12, and RC13 is an LC parallel resonator with a capacitor and an inductor connected in parallel. The resonator RC11 includes a capacitor C11 and an inductor L11 connected in parallel, with one connection node connected to the reference potential (ground potential) and the other connection node connected to the unbalanced terminal T1. That is, the resonator RC11 has a structure in which the capacitor C11 and the inductor L11 are connected in parallel between the unbalanced terminal T1 and the reference potential.

The resonator RC12 includes a capacitor C12 and an inductor L12 connected in parallel, with one connection node connected to the reference potential (ground potential) and the other connection node connected via a capacitor C15 to the unbalanced terminal T1.

The resonator RC13 includes a capacitor C13 and an inductor L13 connected in parallel, with one connection node connected to the reference potential (ground potential). Note that, in the resonator RC13, the other connection node of the capacitor C13 and the inductor L13 is not connected anywhere and is open.

In this manner, each resonator included in the resonant circuit 110 is a "short-circuited resonator", in which the inductor is directly connected to the reference potential. The resonator RC11 and the resonator RC12, and the resonator RC12 and the resonator RC13 are electromagnetically coupled. Also, the resonator RC11 and the resonator RC12 are capacitively coupled by the capacitor C15. By adjusting the resonant frequencies of the resonators RC11, RC12, and RC13, the resonant circuit 110 functions as a band pass filter.

The resonator RC21 included in the resonant circuit 120 includes an inductor L21 and capacitors C21A and C21B. The inductor L21 is connected between the balanced terminals T2 and T3. Also, the capacitors C21A and C21B are connected in series between the balanced terminals T2 and T3. That is, the capacitors C21A and C21B connected in series and the inductor L21 are connected in parallel between the balanced terminals T2 and T3. A connection node between the capacitor C21A and the capacitor C21B is connected to the reference potential.

In the resonator RC21, the balanced terminals T2 and T3 are connected to the reference potential via the capacitors C21A and C21B, respectively, and the inductor L21 is not directly connected to the reference potential. That is, the resonator RC21 is an "open-type resonator".

The resonator RC13 and the resonator RC21 are electromagnetically coupled, and a signal inputted to the unbalanced terminal T1 is transmitted to the resonator RC21 by the electromagnetic coupling. In the resonator RC21, since a circuit connected to the balanced terminal T2 and a circuit connected to the balanced terminal T3 have a symmetric structure with respect to the reference potential, signals having the same amplitude and their phases inverted are outputted from the balanced terminals T2 and T3.

With reference to FIG. 3 to FIG. 5, the filter device 100 includes a dielectric substrate (multilayer body) 130 with a plurality of dielectric layers (a first layer LY1 to a fifth layer LY5) laminated, and has a substantially rectangular-parallelepiped outer shape. On an outer surface of the dielectric substrate 130, a plurality of outer electrodes (side electrodes) each in a substantially C shape are provided, extending over an upper surface 131, side surfaces 133 to 136, and a lower surface 132. The outer electrodes are used for connection with an external device and are used also for connection between electrodes provided to the respectively layers of the dielectric substrate 130. The outer electrodes include the unbalanced terminal T1, the balanced terminals T2 and T3, and ground electrodes GND (reference potential terminal) for connection to the reference potential. The unbalanced terminal T1 is provided on the side surface 136, and the balanced terminals T2 and T3 are provided on the side surfaces 134 and 135, respectively. The ground electrodes GND are provided on the side surfaces 133, 134, and 135. On the upper surface 131 of the dielectric substrate 130, a directional mark DM indicating a direction is attached.

The unbalanced terminal T1 is connected to a plate electrode C0 provided on the third layer LY3. The plate electrode C0 is connected to a via V1A extending from the second layer LY2 to the fourth layer LY4 in the laminating direction (Z-axis direction). The via V1A is connected to a wiring electrode LP1 on the second layer LY2, and is connected to a plate electrode C1 on the fourth layer LY4. The wiring electrode LP1 extends on the second layer LY2 to a Y-axis direction and is connected to a via V1, as depicted in FIG. 4 and FIG. 5.

The via V1 extends from the second layer LY2 to the fifth layer LY5 in the laminating direction, and is connected to a plate electrode CG on the fifth layer LY5. The plate electrode CG is connected to the ground electrode GND formed on the outer surface of the dielectric substrate 130.

The inductor L11 in FIG. 2 includes the vias V1 and V1A and the wiring electrode LP1. Also, the plate electrode C1 on the fourth layer LY4 and the plate electrode CG on the fifth layer LY5 are opposed to each other, and the capacitor C11 in FIG. 2 includes the plate electrode C1 and the plate electrode CG. Therefore, the resonator RC11 in FIG. 2 includes the vias V1 and V1A, the wiring electrode LP1, and the plate electrodes C1 and CG.

The inductor L12 in FIG. 2 includes a wiring electrode LP2 provided on the second layer LY2, a via V2A extending from the second layer LY2 to the fourth layer LY4 in the laminating direction, and a via V2 extending from the second layer LY2 to the fifth layer LY5 in the laminating direction. A plate electrode C2 connected to the via V2A in the fourth layer LY4 is opposed to the plate electrode CG formed on the fifth layer LY5, and the capacitor C12 in FIG. 2 includes the plate electrode C2 and the plate electrode CG. That is, the resonator RC12 in FIG. 2 includes the vias V2 and V2A, the wiring electrode LP2, and the plate electrodes C2 and CG. Note that the plate electrode C0 on the third layer LY3 connected to the unbalanced terminal T1 is opposed to the plate electrode C2 provided on the fourth layer LY4, and the capacitor C15 in FIG. 2 includes the plate electrode C0 and the plate electrode C2.

The inductor L13 in FIG. 2 includes a wiring electrode LP3 provided on the second layer LY2, a via V3A extending from the second layer LY2 to the fourth layer LY4 in the laminating direction, and a via V3 extending from the second layer LY2 to the fifth layer LY5 in the laminating direction. A plate electrode C3 connected to the via V3A in the fourth layer LY4 is opposed to the plate electrode CG formed on the fifth layer LY5, and the capacitor C13 in FIG. 2 includes the plate electrode C3 and the plate electrode CG. That is, the resonator RC13 in FIG. 2 includes the vias V3 and V3A, the wiring electrode LP3, and the plate electrodes C3 and CG.

On the second layer LY2, the wiring electrodes LP1, LP2, and LP3 are spaced in an X-axis direction. Also, a space between the vias V1 and V1A, a space between the vias V2 and V2A, and a space between the vias V3 and V3A are set to be equal or substantially equal. The inductors L11, L12, and L13 are wound around the same winding axis along the X axis, and are electromagnetically coupled to one another.

The resonator RC21 of the resonant circuit 120 includes a wiring electrode LP4, plate electrodes C4, C5, and CG, and vias V4 and V5. The wiring electrode LP4 is provided on the second layer LY2, which is the same layer as that where the wiring electrodes LP1, LP2, and LP3 are provided in the resonant circuit 110. The wiring electrode LP4 has a substantially C chape when viewed in plan view in the laminating direction of the dielectric substrate 130, and is arranged so that an open end of the C shape is oriented to the resonant circuit 110. In other words, it is arranged so that the open end of the wiring electrode LP4 is oriented to a negative direction of the X axis. In the resonator RC21, the wiring electrode LP4 to adjust a difference in line length from the resonator RC13, which is a short-circuited resonator, includes a path extending from connection points with the vias V4 and V5 to a direction away with respect to the resonator RC13, which is a short-circuited resonator. Note that the shape of the wiring electrode LP4 is not limited to the substantially C shape, and may be a V shape, U shape, or meandering shape.

To two end portions of the open end of the wiring electrode LP4, the vias V4 and V5 extending to the fourth layer LY4 in the laminating direction are respectively connected. The via V4 is connected to the plate electrode C4 provided on the fourth layer LY4, and the via V5 is connected to the plate electrode C5 provided on the fourth layer LY4. The inductor L21 in FIG. 2 includes the wiring electrode LP4 and the vias V4 and V5.

The plate electrode C4 is connected to the balanced terminal T2, and the plate electrode C5 is connected to the balanced terminal T3. The plate electrodes C4 and C5 are opposed to the plate electrode CG provided on the fifth layer LY5. The capacitor C21A in FIG. 2 includes the plate electrode C4 and the plate electrode CG. Also, the capacitor C21B in FIG. 2 includes the plate electrode C5 and the plate electrode CG.

A space between the vias V4 and V5 is set to be equal or substantially equal to a space between the vias V3 and V3A of the resonator RC31. The inductor L21 is wound around the winding axis along the X axis, as with the inductors L11, L12, and L13 in the resonant circuit 110. Thus, the resonator RC13 and the resonator RC21 are electromagnetically coupled to cause a signal supplied to the unbalanced terminal T1 to be transmitted via the resonators RC11, RC12, and RC13 to the resonator RC21.

Here, when the wavelength of a signal as a transmission target is taken as $\lambda$, the line length required for the resonators RC11, RC12, and RC13 as short-circuited resonators (that is, the line length of the inductor) is about $\lambda/4$, for example. On the other hand, the line length required for the resonator RC21 as an open-type resonator is about $\lambda/2$, for example. In the respective resonators, since the lengths of the vias provided in the laminating direction are equal or substantially equal, a difference in line length between the resonator RC21 and the resonators RC11, RC12, and RC13 is adjusted with the line length of the wiring electrode LP4 provided on the second layer LY2.

In this manner, vias are used for a portion of the inductor of each of the short-circuited resonators (resonators RC11, RC12, and RC13) and the open-type resonator (resonator RC21) and the length of the via of the short-circuited resonators and the length of the via of the open-type resonator are equal or substantially equal to each other. Thus, even with the structure including an open-type resonator, the dimension of the filter device in a height direction can be reduced to reduce the size of the filter device. Also, in each resonator, the inductor includes the vias. Thus, compared with a case in which an inductor includes a printed coil on a surface of a dielectric layer, the Q factor can be increased. Thus, a degradation in filter characteristics is reduced or prevented. Furthermore, an open-type resonator with a line length of about $\lambda/2$ is used as the resonator RC21 on the output side, and it is thus possible to easily set a phase difference between signals outputted from the balanced terminals T2 and T3 at 180° to thus achieve favorable balance characteristics.

Figures 6A, 6B, 6C:
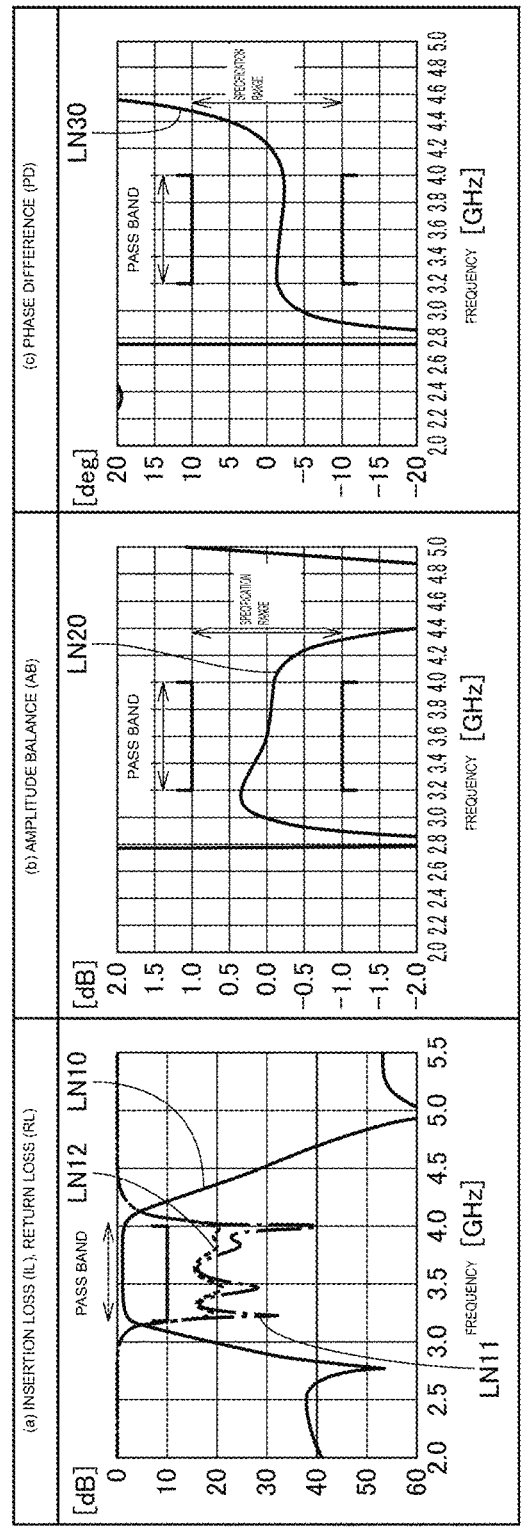
FIGS. 6A to 6C are diagrams depicting the characteristics of the filter device of Preferred Embodiment 1 of the present invention.

FIGS. 6A to 6C depict diagrams describing the characteristics of the filter device 100 of Preferred Embodiment 1. In FIGS. 6A to 6C, insertion loss (IL) and return loss (RL) after balance conversion are depicted in a graph on a left side (FIG. 6A); amplitude balance (AB) between signals outputted from the balanced terminals T2 and T3 are depicted in a center graph (FIG. 6B), and phase difference (PD) of a signal outputted from the balanced terminals T2 and T3 are depicted in a graph on a right side (FIG. 6C). Note that, in FIGS. 6A to 6C, the pass band as a target by the filter device 100 is about 3.2 GHz to about 4.0 GHz, for example.

With reference to FIG. 6A, a solid line LN10 depicts insertion loss from the unbalanced terminal T1 to the balanced terminals T2 and T3, a broken line LN11 depicts return loss at the unbalanced terminal T1, and a one-dot-chain line LN12 depicts return loss in differential mode of the balanced terminals T2 and T3.

As for the insertion loss, about 3.5 dB or lower in a specification range has been achieved through the target pass band. Also, as for the return loss, about 10 dB or lower in a specification range has been achieved through the target pass band.

As for the amplitude balance of FIG. 6B, a difference between the amplitude of a signal outputted from the balanced terminal T3 and the amplitude of a signal outputted from the balanced terminal T2 is indicated as a dB value. As indicated by a solid line LN20 of FIG. 6B, for example, the amplitude balance is about −0.10 dB to about 0.32 in the target pass band, and a value within about ±1.0 dB of the specification range has been achieved.

The phase difference of FIG. 6C indicates a difference between the phase of a signal outputted from the balanced terminal T2 and the phase of a signal outputted from the balanced terminal T3. As indicated by a solid line LN30 of FIG. 6C, for example, the phase deviation is about −2.0° to about −1.3° in the target pass band, and a value within about ±10° of the specification range has been achieved.

As described above, in the filter device 100 of Preferred Embodiment 1, while desired filter characteristics and balance characteristics are achieved, a reduction in size of the entire device is achieved.

Note that the "resonator RC11" and the "resonator RC21" in Preferred Embodiment 1 respectively correspond to a "first resonator" and a "second resonator" in the present disclosure. The "inductor L11" and the "capacitor C11" of the resonator RC11 in Preferred Embodiment 1 respectively correspond to a "first inductor" and a "first capacitor" in the present disclosure. The "inductor L21" of the resonator RC21 in Preferred Embodiment 1 corresponds to a "second inductor" of the present disclosure, and the "capacitor C21A" and the "capacitor C21B" respectively correspond to a "second capacitor" and a "third capacitor" in the present disclosure. The "via V1" and the "via V1A" in Preferred Embodiment 1 respectively correspond to a "first conductor" and a "second conductor" in the present disclosure. The "via V4" and the "via V5" in Preferred Embodiment 1 respectively correspond to a "third conductor" and a "fourth conductor" in the present disclosure. The "wiring electrode LP1" and the "wiring electrode LP4" in Preferred Embodiment 1 respectively correspond to a "first wiring electrode" and a "second wiring electrode" in the present disclosure.

MODIFICATIONS

Modification 1

FIG. 7 is a diagram depicting the inner structure of a filter device 100A of Modification 1. In the filter device 100A, the structure is such that, in the filter device 100 of Preferred Embodiment 1, the wiring electrode LP4 configuring the inductor L21 of the resonant circuit 120 is replaced by a wiring electrode LP4A. In the filter device 100A, description of components overlapping with those of the filter device 100 is not repeated.

With reference to FIG. 7, as with the wiring electrode LP4 of Preferred Embodiment 1, the wiring electrode LP4A in the filter device 100A has a substantially C shape, but the direction of the open end is opposite and the wiring electrode LP4A is arranged so that the open end of the wiring electrode LP4A is oriented to a positive direction of the X axis. In other words, the wiring electrode LP4A includes a path extending from connection points with the vias V4 and V5 to a direction toward the resonant circuit 110. Note that, with this arrangement, the positions of the vias V4 and V5 are changed to positions slightly moved to the positive direction of the X axis, compared with the filter device 100.

Note that the shape of the wiring electrode LP4A is not limited to the substantially C shape, and may be a V shape, U shape, or meandering shape.

In this manner, in the resonant circuit connected to the balanced terminal, a plate electrode of an open-type resonator to adjust the line length with respect to a short-circuited resonator may be extended to a direction approaching the short-circuited resonator.

Modification 2

As described above, it is required to make the line length of the open-type resonator longer than the line length of the short-circuited resonator. However, due to restrictions on the size of the entire filter device and so forth, a case can occur in which the line length required for the open-type resonator cannot be allocated.

In Modification 2, a structure is described in which, when the line length required for the open-type resonator cannot be sufficiently allocated, shortage of the line length is compensated for by capacitively coupling the short-circuited resonator and the open-type resonator.

Figure 8:
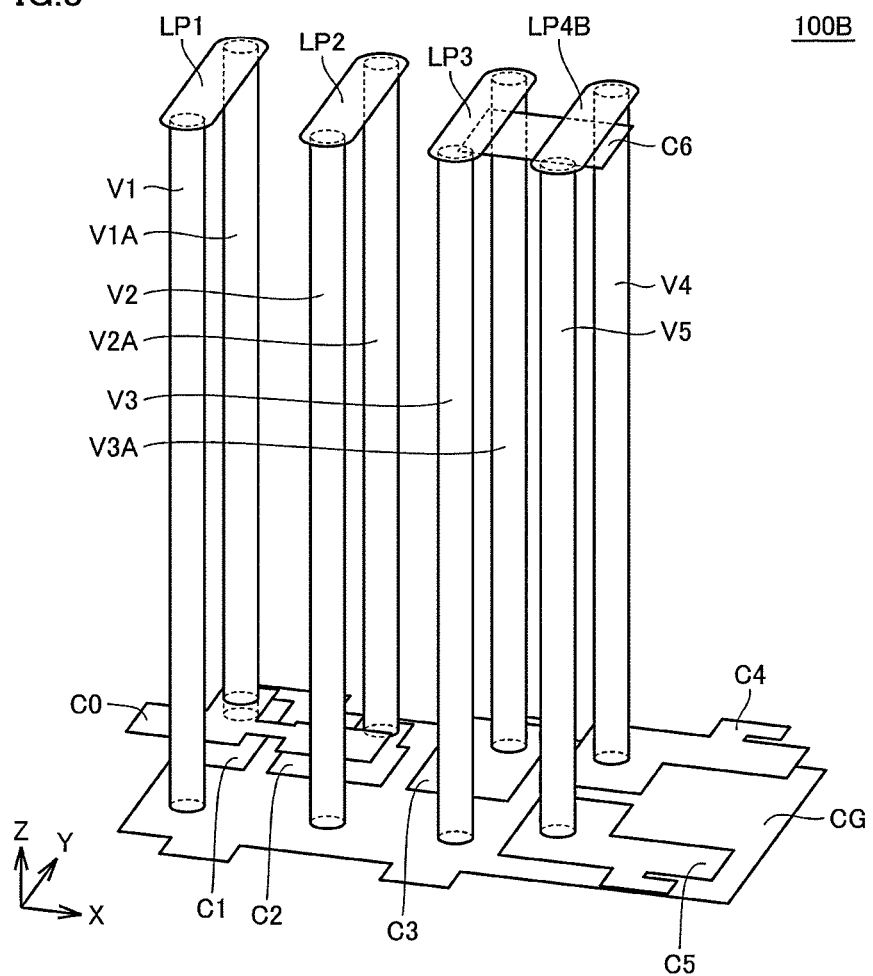
FIG. 8 is a diagram depicting the inner structure of a filter device of Modification 2 of a preferred embodiment of the present invention.

FIG. 8 is a diagram depicting the inner structure of a filter device 100B of Modification 2. With reference to FIG. 8, in the filter device 100B, the structure is such that the wiring electrode LP4 of the resonator RC21 is replaced by a wiring electrode LP4B and a plate electrode C6 opposed to the wiring electrode LP3 of the resonator RC13 and the wiring electrode LP4B of the resonator RC21 is added. In other words, when viewed in plan view from the laminating direction of the multilayer body, the plate electrode C6 is arranged at a position overlapping at least a portion of the wiring electrode LP3 and at least a portion of the wiring electrode LP4B. In the filter device 100B, description of components overlapping with those of the filter device 100 is not repeated.

With reference to FIG. 8, in the filter device 100B, as with the wiring electrode LP3 of the resonator RC13, the wiring electrode LP4B of the resonator RC21 extends to the Y-axis direction, and its line length is also equal or substantially equal to that of the wiring electrode LP3. While the line length of the resonator RC21 as an open-type resonator is adjusted by the length of the wiring electrode LP4 in the filter device 100 of Preferred Embodiment 1, in the case of the structure as in FIG. 8, there is a possibility that the line length of λ/2 required for the resonator RC21 as an open-type resonator cannot be allocated only with wiring electrodes and vias. This state can arise when, for example, the dimension of the filter device in the X-axis direction is limited.

In the filter device 100B, while the wiring electrode LP4B of the resonator RC21 and the wiring electrode LP3 of the resonator RC13 are coupled together by the plate electrode C6 so as to be on a substantially same level in length, as for a shortfall of the line length, the resonant frequency is adjusted by adjusting capacitance components with respect to the reference potential in the resonator RC21. However, when the resonator RC13 and the resonator RC21 are coupled together in this state, in particular, if a region where wiring electrodes, plate electrodes, and vias are arranged is narrow, magnetic coupling between the resonators can become strong. In this case, as depicted in FIG. 8, capacitive coupling between the wiring electrode LP4B and the wiring electrode LP3 is added by the plate electrode C6, thereby adjusting magnetic coupling between the resonators. Note that when capacitive coupling between the wiring electrodes is added, the plate electrode C6 is preferably arranged at a center portion on the line length of the resonator RC21. Since a flowing current becomes zero at the center portion on the line length of the resonator RC21, with the plate electrode C6 arranged at this position, balance characteristics at the resonator RC21 can be retained.

As described above, the short-circuited resonator and the open-type resonator are capacitively coupled, thus allowing the line length of the open-type resonator to be shortened. Thus, a further reduction in size of the filter device can be achieved.

Note that the "plate electrode C6" in Modification 2 corresponds to a "coupling electrode" in the present disclosure.

Modification 3

Figure 9:
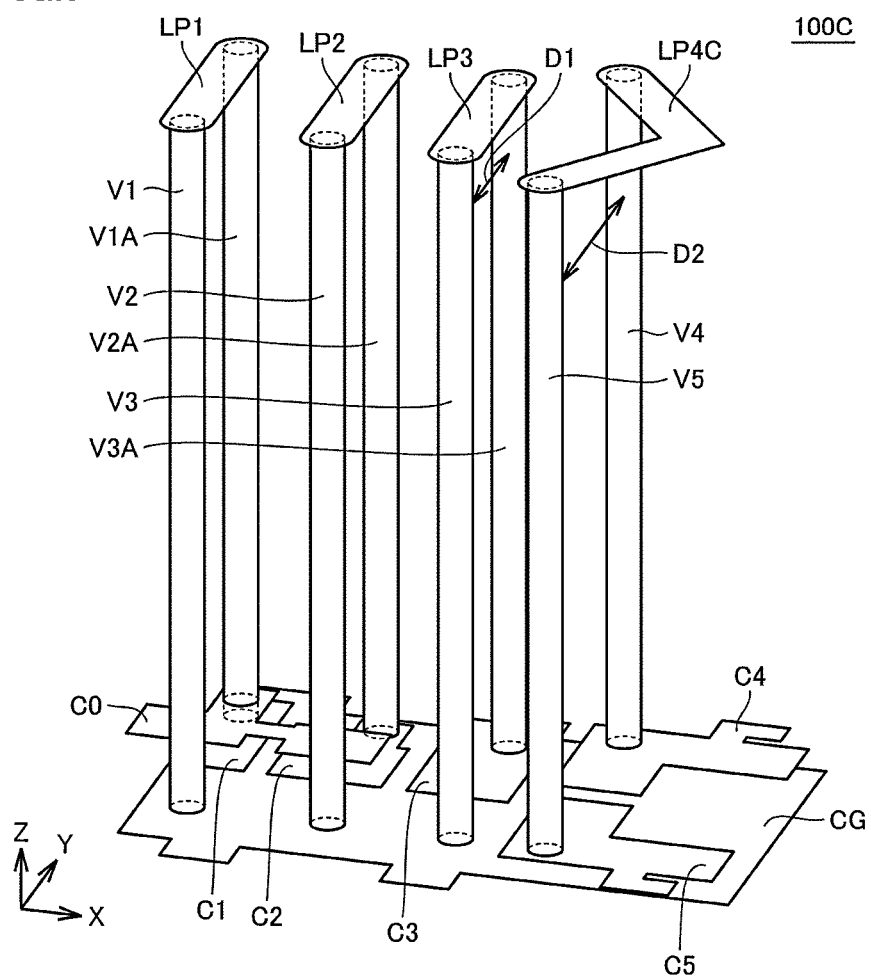
FIG. 9 is a diagram depicting the inner structure of a filter device of Modification 3 of a preferred embodiment of the present invention.

FIG. 9 is a diagram depicting the inner structure of a filter device 100C of Modification 3. In the filter device 100C, a space D2 between the vias V4 and V5 configuring the inductor L21 of the resonant circuit 120 connected to the balanced terminals T2 and T3 is wider than a space D1 between the vias V3 and V3A configuring the inductor L13 of the resonant circuit 110 connected to the unbalanced terminal T1 (D1<D2).

In electromagnetic coupling between the resonator RC13 and the resonator RC21, the via V3 of the resonator RC13 and the via V5 of the resonator RC21 are coupled together, and the via V3A of the resonator RC13 and the via V4 of the resonator RC21 are coupled together. Here, when the space D2 between the vias of the resonator RC21 is narrower than the space D1 between the vias of the resonator RC13, there is a possibility that the via V3 of the resonator RC13 is also coupled with the via V4 of the resonator RC21 and the via V3A of the resonator RC13 is also coupled with the via V5 of the resonator RC21. Since the direction of a current flowing through the via V3 and the direction of a current flowing through the via V4 are opposite, if the via V4 is coupled with both of the via V3 and the via V3A, there is a danger that a portion of the signals to be transmitted may be canceled out, leading to an increase in insertion loss.

As in the filter device 100C of Modification 3, since the space D2 between the vias of the resonator RC21 is wider than the space D1 between the vias of the resonator RC13, coupling between the via V4 and the via V3 and coupling between the via V5 and the via V3A are reduced, and thus an increase in insertion loss can be reduced or prevented. Also, the air-core diameter of the inductor L21 is increased to allowing an increase in inductance of the inductor L21. Thus, the Q factor of the resonator RC21 is enhanced to allow an improvement in bandpass characteristics.

Note that while a wiring electrode LP4C configuring the inductor L21 has a substantially V shape in FIG. 9, as with Preferred Embodiment 1, the shape may be substantially C shape.

Modification 4

In Modification 4, the structure of a filter device capable of direct-current power supply from an open-type resonator connected to a balanced terminal to an external device is described.

Figure 10:
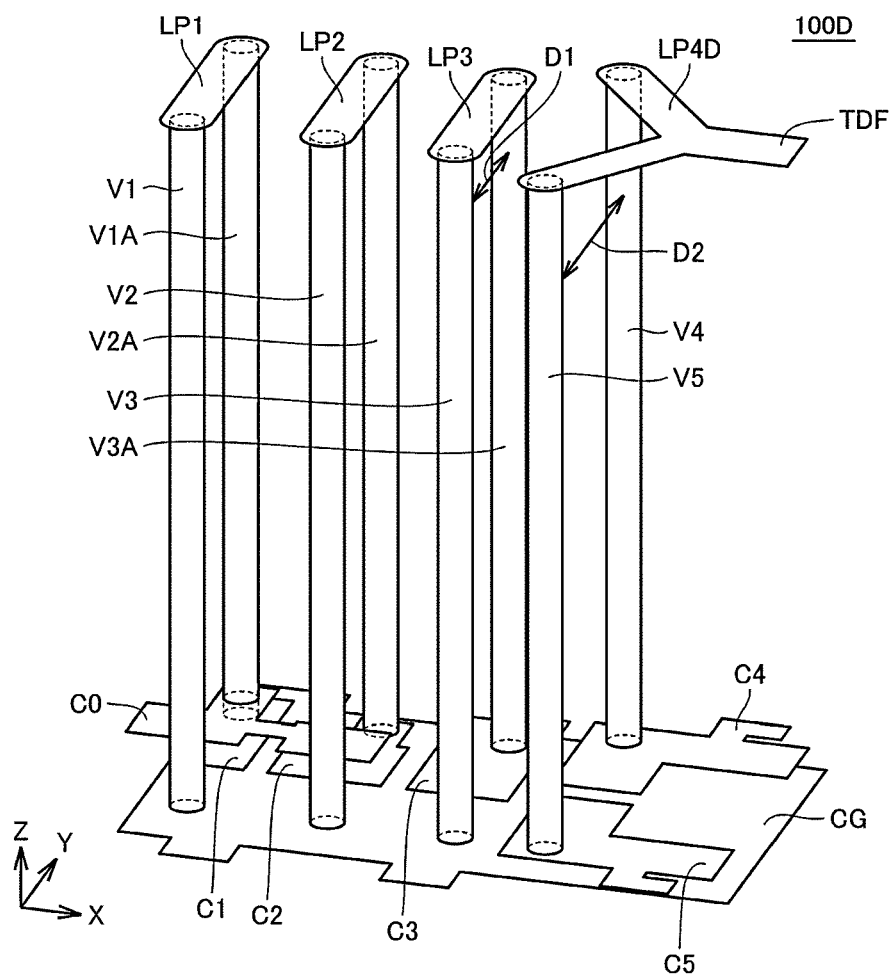
FIG. 10 is a diagram depicting the inner structure of a filter device of Modification 4 of a preferred embodiment of the present invention.

FIG. 10 is a diagram depicting the inner structure of a filter device 100D of Modification 4. In the filter device 100D, a power feeding terminal for direct-current power supply is provided at a center portion on the line length in the resonator RC21 as an open-type resonator. More specifically, in the resonator RC21, since the vias V4 and V5 are equal in length, a power feeding terminal TDF is connected at a center portion of a wiring electrode LP4D. The power feeding terminal TDF is connected to an outer electrode for power feeding (not depicted) provided on an outer surface of the dielectric substrate 130. With another device is connected to the outer electrode, direct-current power is supplied to the connected device.

In the open-type resonator, the center on the line length (that is, the center of the inductor L21) is a position which has a predetermined potential with respect to the reference potential and where a flowing current is zero. Thus, power supplied from the center on the line length does not influence signals outputted from the balanced terminals T2 and T3 (that is, currents outputted from the balanced terminals T2 and T3).

Therefore, with a terminal for power supply provided at the center portion on the line length of the open-type resonator, the filter device can be used also as a direct-current power without influencing the characteristics of the filter device.

Note that, as with Preferred Embodiment 3 of FIG. 9, the space between the vias in the open-type resonator is wider than the space between the vias in the short-circuited resonator in FIG. 10, but as in the filter device depicted in FIG. 4 and FIG. 5, the space between the vias in the open-type resonator and the space between the vias in the short-circuited resonator may be equal.

Figure 11:
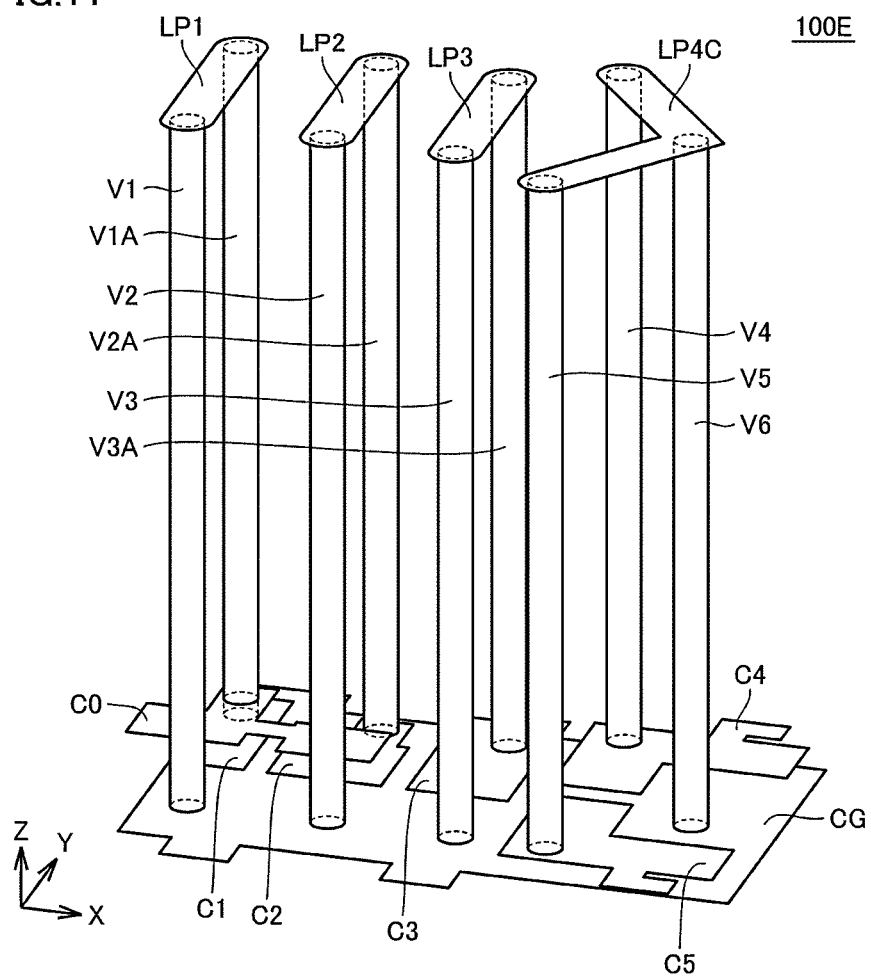
FIG. 11 is a diagram depicting the inner structure of a filter device of a reference example.

Also, since the current flowing through the center on the line length of the open-type resonator is zero, as in a filter device 100E of a reference example depicted in FIG. 11, even if the center portion on the line length of the resonator RC21 is connected to the plate electrode CG via a via V6, this does not influence the characteristics of the filter device.

Modification 5

In Preferred Embodiment 1 and each of the modifications described above, the structure is described in which vias penetrating through a dielectric layer are used as conductors for interlayer connection. In Modification 5, a structure is described in which side electrodes provided on side surfaces of a dielectric substrate are used as conductors for interlayer connection.

Figure 12:
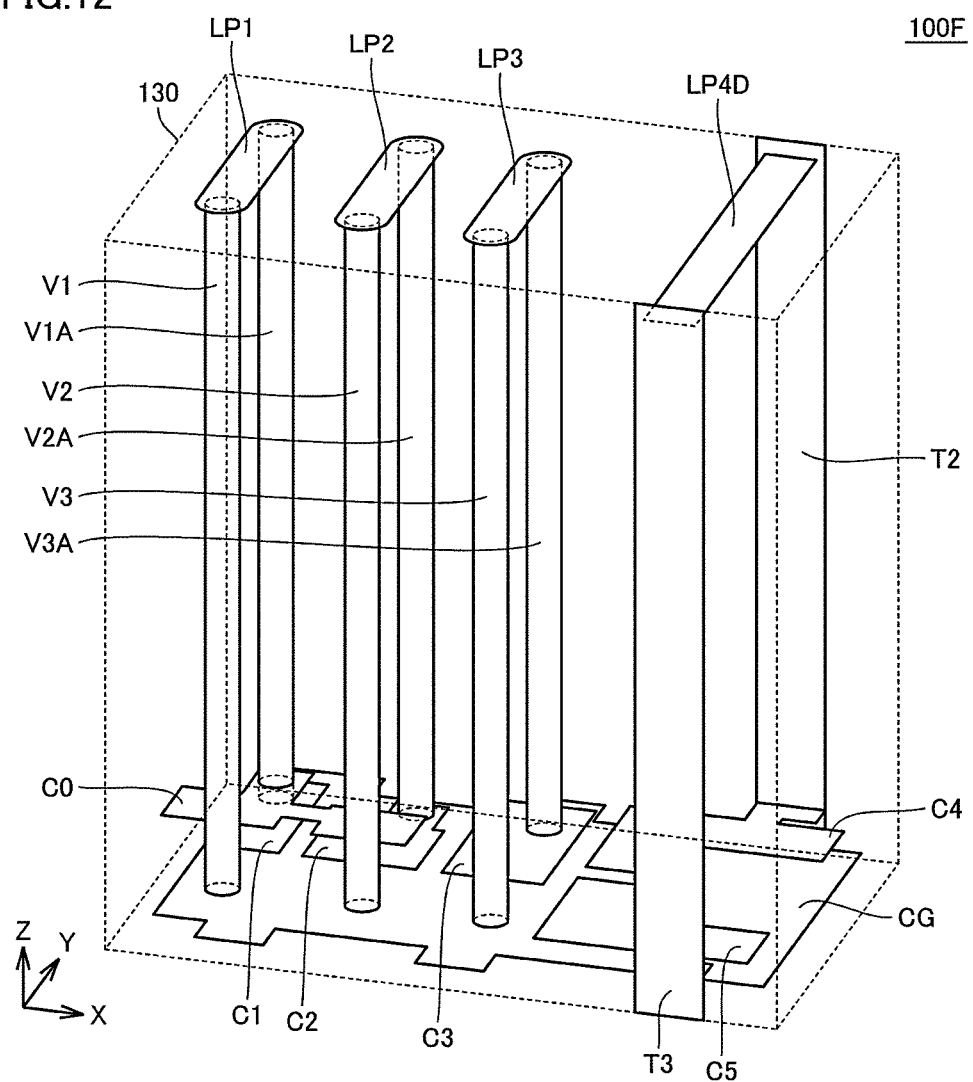
FIG. 12 is a diagram depicting the inner structure of a filter device of Modification 5 of a preferred embodiment of the present invention.

FIG. 12 is a diagram depicting the inner structure of a filter device 100F of Modification 5. In the filter device 100F, as conductors connecting the wiring electrode LP4D in the resonator RC21 and the plate electrodes C4 and C5 of the resonant circuit 120, side electrodes provided on side surfaces of the dielectric substrate 130 are used. More specifically, the balanced terminals T2 and T3 are used as side electrodes.

As described above, the open-type resonator requires a line length longer than that of the short-circuited resonator. By using the side electrodes, the space between conductors can be widely taken, and thus the line length of the open-type resonator (resonator RC21) can be lengthened. Also, since the space between the electrodes becomes wide, as described in Modification 3, it is possible to prevent the state in which each side electrode is coupled to both of the vias V3 and V3A of the resonator RC13. Thus, insertion loss can be reduced. Furthermore, the air-core diameter of the inductor L21 configured of the wiring electrode LP4D and the side electrodes is increased, and inductance of the inductor L21 can be increased. With this, the Q factor of the resonator RC21 is enhanced to allow an improvement in bandpass characteristics.

Note that while the example is described in FIG. 12 in which the conductors in the resonator RC21 on a resonant circuit 120 side include side electrodes, in place of this or in addition to this, conductors in the resonator on a resonant circuit 110 side may include side electrodes. Also, when each resonant circuit has a plurality of resonators, conductors in a portion of the resonators among the plurality of resonators may include side electrodes.

Modification 6

While the structure is described in the filter device 100 of Preferred Embodiment 1 in which the resonant circuit 110 connected to the unbalanced terminal T1 includes three resonators RC11, RC12, and RC13, the number of resonators included in each resonant circuit may be one, as in the resonant circuit 120.

Figure 13:
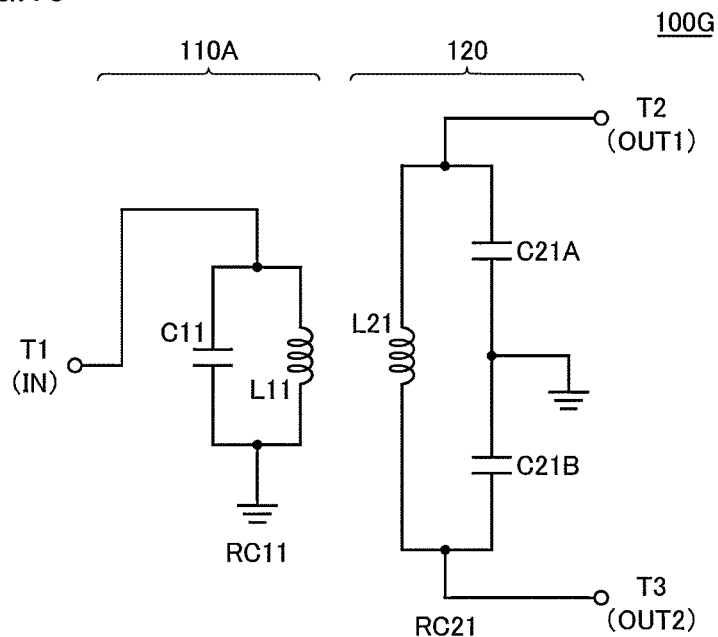
FIG. 13 is an equivalent circuit diagram of a filter device of Modification 6 of a preferred embodiment of the present invention.

FIG. 13 is an equivalent circuit diagram of a filter device 100G of Modification 6. In the filter device 100G, the structure is such that the resonant circuit 110 in the filter device 100 is replaced by a resonant circuit 110A. In the filter device 100G, description of components overlapping with those of the filter device 100 is not repeated.

With reference to FIG. 13, the resonant circuit 110A includes one resonator RC11 configured of the inductor L11 and the capacitor C11. That is, the filter device 100G is configured with the resonators RC12 and RC13 in the filter device 100 removed therefrom. As described above, in the filter device 100, three resonators are used, and thus the resonant circuit 110 on an unbalanced terminal T1 side defines and functions as a band pass filter. If a desired pass band is varied, as in the filter device 100G of Modification 6, a resonant circuit may include a single resonator.

Also in this structure, with a short-circuited resonator being used in the resonant circuit connected to the unbalanced terminal on the input side and an open-type resonator being used in the resonant circuit connected to the balanced terminal on the output side, a reduction in size of the device can be achieved while low loss and favorable balance characteristics are achieved.

Modification 7

In Modification 7, a structure is described in which the resonant circuit connected to the balanced terminals T2 and T3 includes a plurality of resonators.

Figure 14:
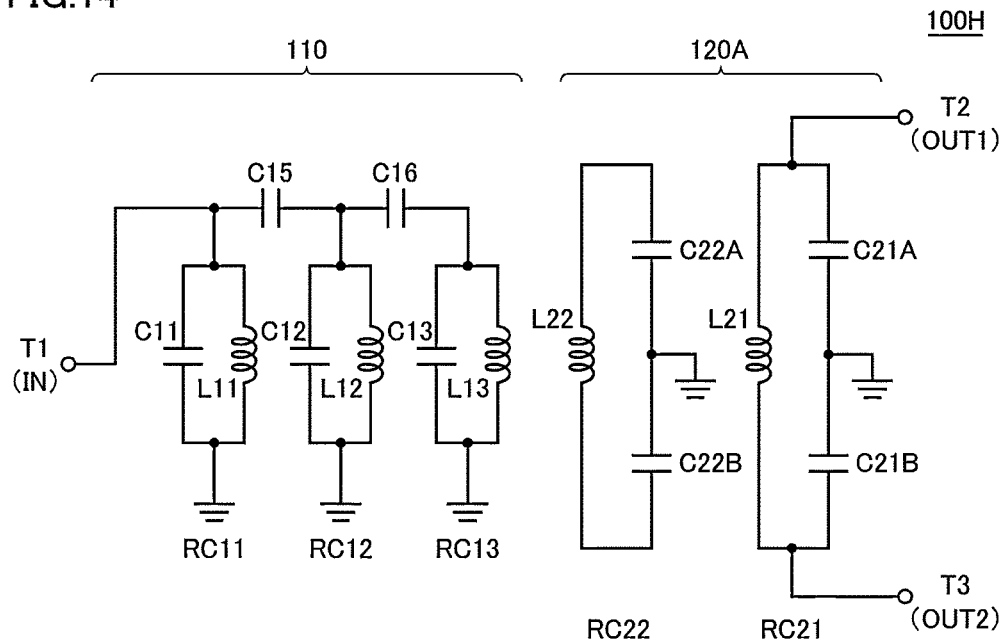
FIG. 14 is an equivalent circuit diagram of a filter device of Modification 7 of a preferred embodiment of the present invention.

FIG. 14 is an equivalent circuit diagram of a filter device 100H of Modification 7. In the filter device 100H, the structure is such that the resonant circuit 120 in the filter device 100 is replaced by a resonant circuit 120A. In the filter device 100H, description of components overlapping with those of the filter device 100 is not repeated.

With reference to FIG. 14, in the filter device 100H, the resonant circuit 120A is configured to include two resonators RC21 and RC22. As with the resonant circuit 120 in Preferred Embodiment 1, the resonator RC21 is connected to the balanced terminals T2 and T3.

The resonator RC22 includes an inductor L22 and capacitors C22A and C22B. The capacitor C22A and the capacitor C22B are connected in series, and the capacitors C22A and C22B connected in series are connected to the inductor L22 in parallel. A connection node between the capacitor C22A and the capacitor C22B is connected to the reference potential. That is, the resonator RC22 corresponds to an open-type resonator in which the inductor L22 is connected via the capacitors C22A and C22B to the reference potential.

The resonator RC22 is arranged between the resonator RC21 and the resonator RC13 of the resonant circuit 110. A signal supplied to the unbalanced terminal T1 passes through the resonators RC11, RC12, and RC13 and is transmitted to the resonator RC22 by electromagnetic coupling between the resonator RC13 and the resonator RC22. The signal transmitted to the resonator RC22 is further transmitted from the resonator RC22 to the resonator RC21 by electromagnetic coupling, and is outputted from the balanced terminals T2 and T3.

In this manner, even if the resonant circuit connected to the balanced terminal includes a plurality of resonators, with a short-circuited resonator being used in the resonant circuit connected to the unbalanced terminal on the input side and an open-type resonator being used in the resonant circuit connected to the balanced terminal on the output side, a reduction in size of the device can be achieved while low loss and favorable balance characteristics are achieved.

Preferred Embodiment 2

In Preferred Embodiment 2, an example is described in which, in a multiplexer configured of a plurality of filter devices, the structure of the filter device of Preferred Embodiment 1 is applied to at least one filter device.

Figure 15:
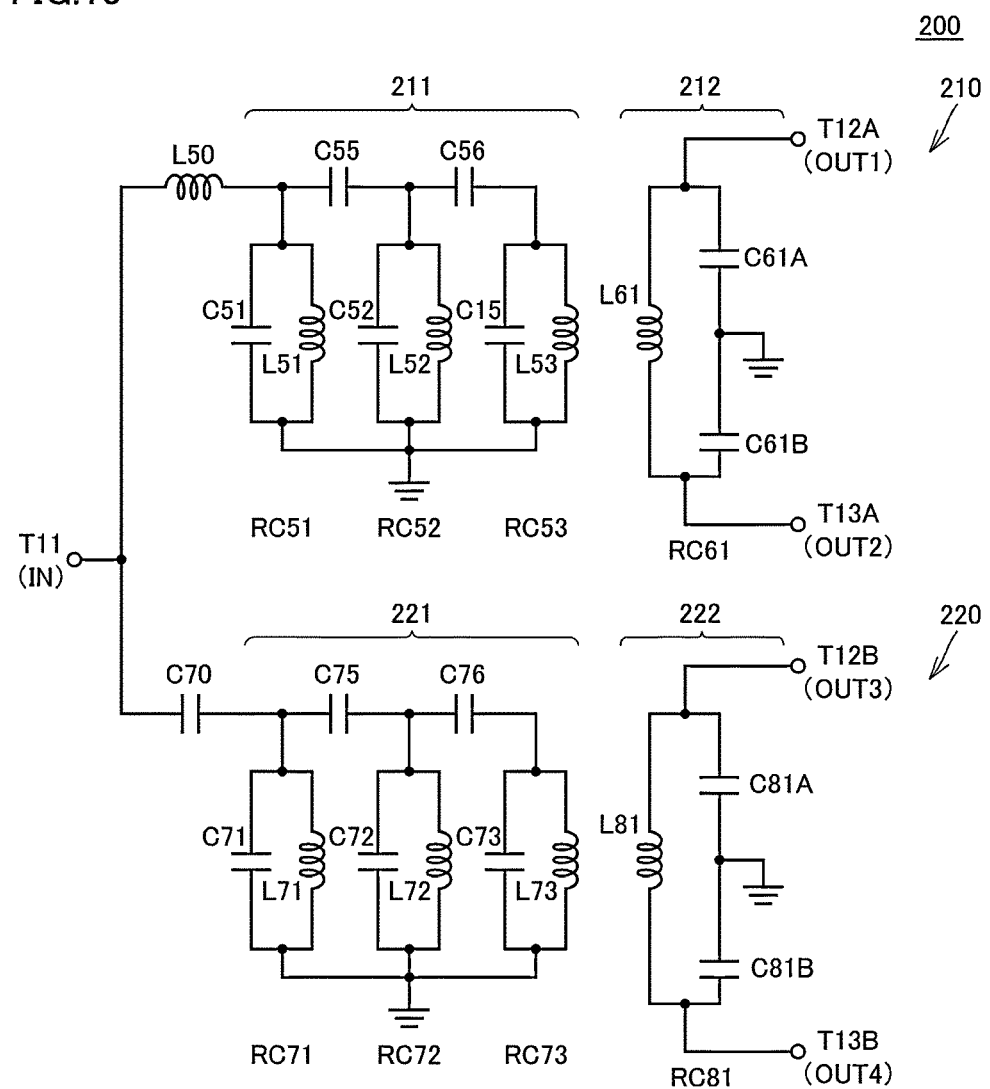
FIG. 15 is an equivalent circuit diagram of a diplexer according to Preferred Embodiment 2 of the present invention.

FIG. 15 is an equivalent circuit diagram of a diplexer 200 according to Preferred Embodiment 2. While an example of a diplexer including two filter devices is described as a multiplexer in FIG. 15, the multiplexer may include three or more filter devices.

With reference to FIG. 15, the diplexer 200 includes two filter devices 210 and 220 with different frequency bands. The filter device 210 is connected to an unbalanced terminal T11 via an inductor L50 functioning as a low pass filter. Also, the filter device 220 is connected to the unbalanced terminal T11 via a capacitor C70 functioning as a high pass filter. The unbalanced terminal T11 is connected to, for example, an antenna not depicted. The filter device 210 is configured so as to let a signal in, for example, an approximately 2 GHz band (about 2.4 GHz to about 2.5 GHz) pass. Also, the filter device 220 is configured so as to let a signal in, for example, an approximately 5 GHz to 7 GHz band (about 5.15 GHz to about 7.125 GHz) pass, which is higher than that of the filter device 210.

The filter device 210 includes a resonant circuit 211 connected to the unbalanced terminal T11 and a resonant circuit 212 connected to balanced terminals T12A and T13A. The resonant circuit 211 includes three-stage resonators RC51, RC52, and RC53. Each of the resonators RC51, RC52, and RC53 is a short-circuited resonator with an inductor and a capacitor connected in parallel.

The resonator RC51 includes an inductor L51 and a capacitor C51 connected in parallel. One connection node of the resonator RC51 is connected to the reference potential, and the other connection node is connected to the inductor L50. The resonator RC52 includes an inductor L52 and a capacitor C52 connected in parallel. One connection node of the resonator RC52 is connected to the reference potential, and the other connection node is connected to the inductor L50 via a capacitor C55. The resonator RC53 includes an inductor L53 and a capacitor C53 connected in parallel. One connection node of the resonator RC53 is connected to the reference potential, and the other connection node is connected to the inductor L50 via the capacitor C55 and a capacitor C56.

The resonant circuit 212 includes a resonator RC61. The resonator RC61 includes an inductor L61 and capacitors C61A and C61B. The inductor L61 is connected between the balanced terminals T12A and T13A. Also, the capacitors C61A and C61B are connected in series between the balanced terminals T12A and T13A. That is, the capacitors C61A and C61B connected in series and the inductor L61 are connected in parallel between the balanced terminals T12A and T13A. A connection node between the capacitor C61A and the capacitor C61B is connected to the reference potential. That is, the resonator RC61 is an open-type resonator.

Similarly, the filter device 220 includes a resonant circuit 221 connected to the unbalanced terminal T11 and a resonant circuit 222 connected to balanced terminals T12B and T13B. The resonant circuit 221 includes three-stage resonators RC71, RC72, and RC73. Each of the resonators RC71, RC72, and RC73 is a short-circuited resonator with an inductor and a capacitor connected in parallel.

The resonator RC71 includes an inductor L71 and a capacitor C71 connected in parallel. One connection node of the resonator RC71 is connected to the reference potential, and the other connection node is connected to the capacitor C70. The resonator RC72 includes an inductor L72 and a capacitor C72 connected in parallel. One connection node of the resonator RC72 is connected to the reference potential, and the other connection node is connected to the capacitor C70 via a capacitor C75. The resonator RC73 has an inductor L73 and a capacitor C73 connected in parallel. One connection node of the resonator RC73 is connected to the reference potential, and the other connection node is connected to the capacitor C70 via the capacitor C75 and a capacitor C76.

The resonant circuit 222 includes a resonator RC81. The resonator RC81 includes an inductor L81 and capacitors C81A and C81B. The inductor L81 is connected between the balanced terminals T12B and T13B. Also, the capacitors C81A and C81B are connected in series between the balanced terminals T12B and T13B. That is, the capacitors C81A and C81B connected in series and the inductor L81 are connected in parallel between the balanced terminals T12B and T13B. A connection node between the capacitor C81A and the capacitor C81B is connected to the reference potential. That is, the resonator RC81 is an open-type resonator.

In this manner, each of the filter device 210 and the filter device 220 has a structure similar to that of the filter device 100 described in Preferred Embodiment 1, except for the connection between the resonator RC52 and the resonator RC53 and the connection between the resonator RC72 and the resonator RC73.

Figure 16:
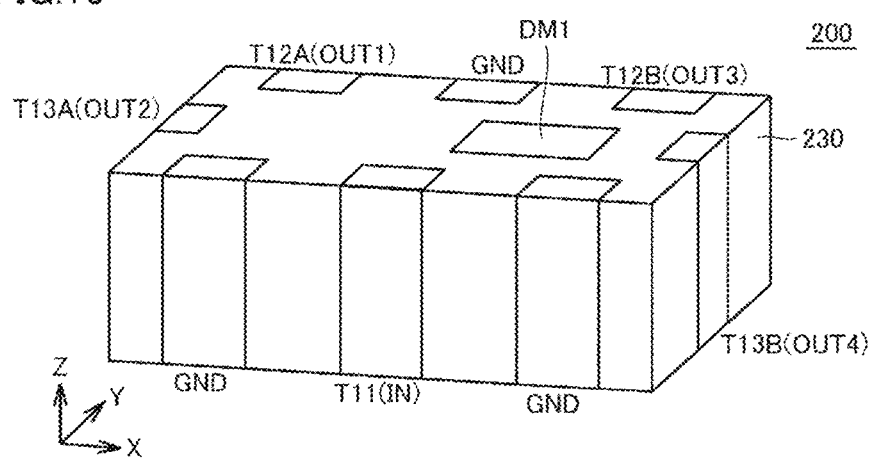
FIG. 16 is a perspective view of the outer shape of the diplexer of FIG. 15.
Figure 17:
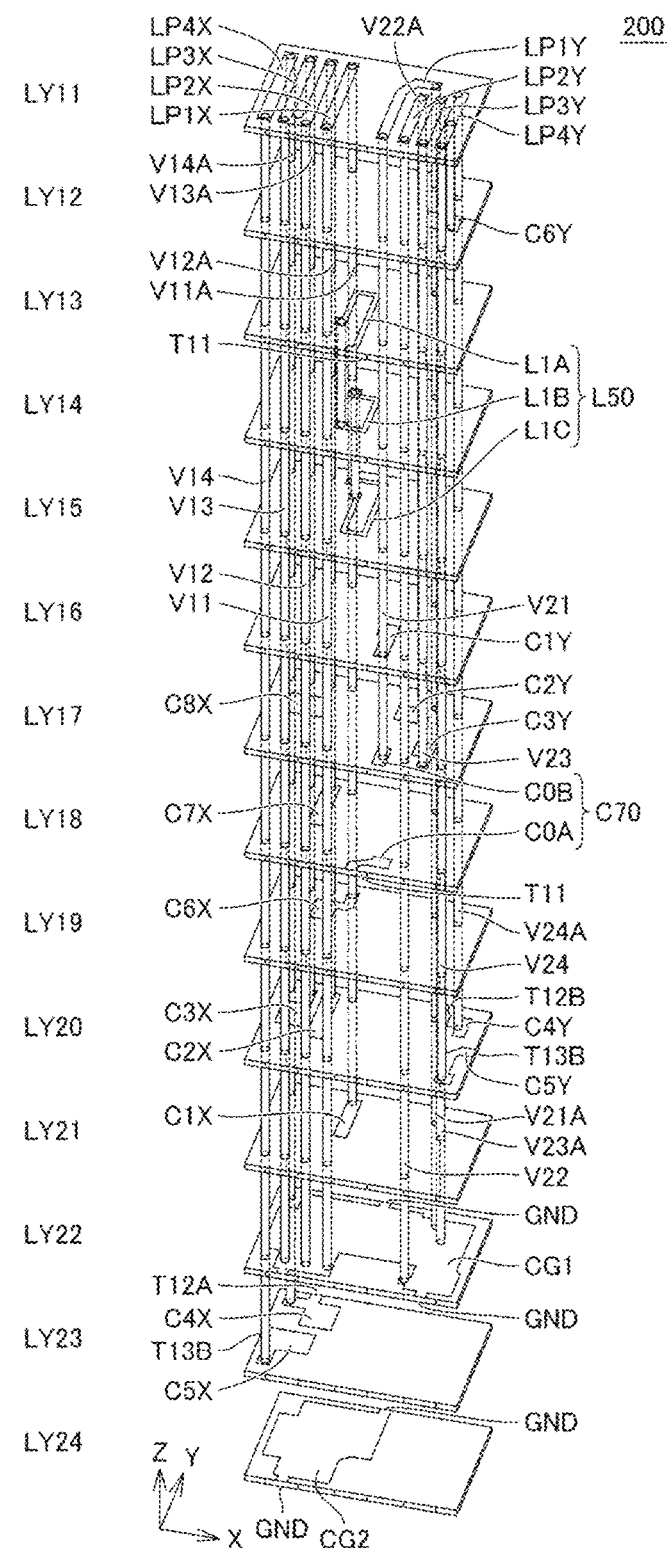
FIG. 17 is an exploded perspective view of the diplexer of FIG. 16.

FIG. 16 is a perspective view of the outer shape of the diplexer 200 of FIG. 15. FIG. 17 is an exploded perspective view of the diplexer 200. With reference to FIG. 16 and FIG. 17, the diplexer 200 includes a dielectric substrate (multilayer body) 230 with a plurality of dielectric layers (an 11th layer LY11 to a 24th layer LY24) laminated, and has a substantially rectangular-parallelepiped outer shape. On an outer surface of the dielectric substrate 230, a plurality of outer electrodes each in a substantially C shape are provided, extending over an upper surface, side surfaces, and a lower surface. The outer electrodes are used for connection with an external device and are used also for connection between wiring patterns on each layer of the dielectric substrate 230. The outer electrodes include the unbalanced terminal T11, the balanced terminals T12A, T12B, T13A, and T13B, and ground electrodes GND for connection to the reference potential. On an upper surface of the dielectric substrate 230, a directional mark DM1 indicating a direction is attached.

In the diplexer 200, a filter device 210 is provided on a portion on a left side of FIG. 17, and a filter device 220 is provided on a right-side portion of FIG. 17. Details of the structures of the filter devices 210 and 220 in the dielectric substrate 230 are described below.

First, the filter device 210 on a low frequency band side is described. The unbalanced terminal T11 is connected to a wiring electrode L1A provided on the 13th layer LY13. The wiring electrode L1A is connected in series with a wiring electrode L1B provided on the 14th layer LY14 and a wiring electrode L1C provided on the 15th layer LY15. The wiring electrodes L1A, L1B, and L1C in FIG. 15 configure an inductor L50.

One end of the wiring electrode L1C is connected to a via V11A extending from the 11th layer LY11 to the 21st layer LY21 in the laminating direction (Z-axis direction). The via V11A is connected to a wiring electrode LP1X on the 11th layer LY11. Also, the via V11A is connected to a plate electrode C6X on the 19th layer LY19, and is connected to a plate electrode C1X on the 21st layer LY21. The wiring electrode LP1X extends to the Y-axis direction on the 11th layer LY11 and is connected to a via V11.

The via V11 extends from the 11th layer LY11 to the 22nd layer LY22 in the laminating direction, and is connected to a plate electrode CG1 on the 22nd layer LY22. The plate electrode CG1 is connected to a ground electrode GND provided on an outer surface of the dielectric substrate 230.

The inductor L51 in FIG. 15 includes the vias V11 and V11A and the wiring electrode LP1X. Also, the plate electrode C1X on the 21st layer LY21 and the plate electrode CG1 on the 22nd layer LY22 are opposed to each other, and the capacitor C51 in FIG. 15 includes the plate electrode C1X and the plate electrode CG1. Therefore, the vias V11 and V11A, the wiring electrode LP1X, and the plate electrodes C1X and CG1 configure the resonator RC51 in FIG. 15.

A wiring electrode LP2X provided on the 11th layer LY11, a via V12A extending from the 11th layer LY11 to the 20th layer LY20 in the laminating direction, and a via V12 extending from the 11th layer LY11 to the 22nd layer LY22 in the laminating direction configure the inductor L52 in FIG. 15. A plate electrode C2X connected to the via V12A in the 20th layer LY20 is opposed to the plate electrode CG1 provided on the 22nd layer LY22, and the plate electrode C2X and the plate electrode CG1 configure the capacitor C52 in FIG. 15. That is, the vias V12 and V12A, the wiring electrode LP2X, and the plate electrodes C2X and CG1 configure the resonator RC52 in FIG. 15. Note that a portion of the plate electrode C6X on the 19th layer LY19 connected to the via V11A is opposed to a plate electrode C7X connected to the via V12A in the 18th layer LY18 and the plate electrode C2X on the 20th layer LY20, and the plate electrodes C2X, C6X, and C7X configure the capacitor C55 in FIG. 15.

A wiring electrode LP3X provided on the 11th layer LY11, a via V13A extending from the 11th layer LY11 to the 20th layer LY20 in the laminating direction, and a via V13 extending from the 11th layer LY11 to the 22nd layer LY22 in the laminating direction configure the inductor L53 in FIG. 15. A plate electrode C3X connected to the via V13A in the 20th layer LY20 is opposed to the plate electrode CG1 provided on the 22nd layer LY22, and the plate electrode C3X and the plate electrode CG1 configure the capacitor C53 in FIG. 15. That is, the vias V13 and V31A, the wiring electrode LP3X, and the plate electrodes C3X and CG1 configure the resonator RC53 in FIG. 15. Note that the plate electrode C3X provided on the 20th layer LY20 and the plate electrode C7X provided on the 18th layer LY18 are partially opposed to a plate electrode C8X provided on the 17th layer LY17, and the plate electrodes C3X, C7X, and C8X configure the capacitor C56 in FIG. 15.

The resonator RC61 of the resonant circuit 212 includes a wiring electrode LP4X, plate electrodes C4X, CSX, CG1, and CG2, and vias V14 and V14A. The wiring electrode LP4X is provided on the 11th layer LY11, which is the same layer as that where the wiring electrodes LP1X, LP2X, and LP3X are provided in the resonant circuit 211. The wiring electrode LP4X is connected to the vias V14 and V14A extending from the 11th layer LY11 to the 23rd layer LY23 in the laminating direction. The wiring electrode LP4X and the vias V14 and V14A configure an inductor L61 in FIG. 15.

The via V14 and the via V14A are respectively connected to the plate electrode C5X and the plate electrode C4X on the 23rd layer LY23. The plate electrode C4X is connected to the balanced terminal T12A, and the plate electrode C5X is connected to the balanced terminal T13A. The plate electrodes C4X and C5X are opposed to the plate electrode CG1 provided on the 22nd layer LY22 and the plate electrode CG2 provided on the 24th layer LY24, configuring the capacitors C61A and C61B, respectively, in FIG. 15. The plate electrode CG2 is connected to the ground electrode GND on the 24th layer LY24.

Each inductor in the resonators RC51, RC52, RC53, and RC61 is wound around a common winding axis. Thus, a high frequency signal supplied to the unbalanced terminal T11 is transmitted by electromagnetic coupling occurring between the resonators, and is outputted from the balanced terminals T12A and T13A.

Next, the filter device 220 on a high frequency band side is described. A plate electrode COA provided on the 18th layer LY18 is connected to the unbalanced terminal T11. The plate electrode COA is opposed to a plate electrode COB provided on the 17th layer LY17. The plate electrode C0A and the plate electrode C0B configure the capacitor C70 in FIG. 15.

The plate electrode C0B is connected to one end of a wiring electrode LP1Y provided on the 11th layer LY11 via a via V21 extending from the 11th layer LY11 to the 18th layer LY18 in the laminating direction. The other end of the wiring electrode LP1Y is connected to the plate electrode CG1 of the 22nd layer LY22 via a via V21A extending from the 11th layer LY11 to the 22nd layer LY22 in the laminating direction. That is, the wiring electrode LP1Y and the vias V21 and V21A configure the inductor L71 in FIG. 15. A plate electrode C1Y connected to the via V21 on the 16th layer LY16 is opposed to the plate electrode CG1 provided on the 22nd layer LY22, and the plate electrode C1Y and the plate electrode CG1 configure the capacitor C71 in FIG. 15. That is, the vias V21 and V21A, the wiring electrode LP1Y, and the plate electrodes C1Y and CG1 configure the resonator RC71 in FIG. 15.

A wiring electrode LP2Y provided on the 11th layer LY11, a via V22A extending from the 11th layer LY11 to the 17th layer LY17 in the laminating direction, and a via V22 extending from the 11th layer LY11 to the 22nd layer LY22 in the laminating direction configure the inductor L72 in FIG. 15. A plate electrode C2Y connected to the via V22A in the 17th layer LY17 is opposed to the plate electrode CG1 provided on the 22nd layer LY22, and the plate electrode C2Y and the plate electrode CG1 configure the capacitor C72 in FIG. 15. That is, the vias V22 and V22A, the wiring electrode LP2Y, and the plate electrodes C2Y and CG1 configure the resonator RC72 in FIG. 15. Note that the capacitor C75 between the resonator RC71 and the resonator RC72 in FIG. 15 includes parasitic capacitance between the inductor L71 configured of the wiring electrode LP1Y and the vias V21 and V21A and the inductor L72 configured of the wiring electrode LP2Y and the vias V22 and V22A.

A wiring electrode LP3Y provided on the 11th layer LY11, a via V23 extending from the 11th layer LY11 to the 17th layer LY17 in the laminating direction, and a via V23A extending from the 11th layer LY11 to the 22nd layer LY22 in the laminating direction configure the inductor L73 in FIG. 15. A plate electrode C3Y connected to the via V23 in the 17th layer LY17 is opposed to the plate electrode CG1 provided on the 22nd layer LY22, and the plate electrode C3Y and the plate electrode CG1 configure the capacitor C73 in FIG. 15. That is, the vias V23 and V23A, the wiring electrode LP3Y, and the plate electrodes C3Y and CG1 configure the resonator RC73 in FIG. 15. Note that the capacitor C76 between the resonator RC72 and the resonator RC73 in FIG. 15 includes parasitic capacitance between the inductor L72 configured of the wiring electrode LP2Y and the vias V22 and V22A and the inductor L73 configured of the wiring electrode LP3Y and the vias V23 and V23A.

The resonator RC81 of the resonant circuit 222 includes a wiring electrode LP4Y, plate electrodes C4Y, C5Y, and CG1, and vias V24 and V24A. The wiring electrode LP4Y is provided on the 11th layer LY11, which is the same layer as that where the wiring electrodes LP1Y, LP2Y, and LP3Y are provided in the resonant circuit 221. The wiring electrode LP4Y is connected to the vias V24 and V24A extending from the 11th layer LY11 to the 20th layer LY20 in the laminating direction. The wiring electrode LP4Y and the vias V24 and V24A configure an inductor L81 in FIG. 15.

The via V24 and the via V24A are respectively connected to the plate electrode C5Y and the plate electrode C4Y on the 20th layer LY20. The plate electrode C4Y is connected to the balanced terminal T12B, and the plate electrode C5Y is connected to the balanced terminal T13B. The plate electrodes C4Y and C5Y are opposed to the plate electrode CG1 provided on the 20th layer LY20, configuring the capacitors C81A and C81B, respectively, in FIG. 15.

Also, a plate electrode C6Y provided on the 12th layer LY12 is opposed to the wiring electrode LP4Y of the resonator RC81 and the wiring electrode LP3Y of the resonator RC73, and the wiring electrode LP4Y and the wiring electrode LP3Y are capacitively coupled by the plate electrode C6Y. As described in Modification 2 above, by capacitive coupling using the plate electrode C6Y, a difference between the line length of the resonator RC73 and the line length of the resonator RC81 is adjusted.

Each inductor in the resonators RC71, RC72, RC73, and RC81 is wound around a common winding axis. Thus, a high frequency signal supplied to the unbalanced terminal T11 is transmitted by electromagnetic coupling occurring between the resonators, and is outputted from the balanced terminals T12B and T13B.

As described above, in the multiplexer including two or more filter devices, the filter device described in Preferred Embodiment 1 and each modification is applied as at least one filter device. Thus, a reduction in size can be achieved while a degradation in filter characteristics is reduced or prevented.

Note that, in the resonant circuit 211 of the filter device 210, the vias V11, V12, and V13 connected to the reference potential are arranged on the same side, and the direction of current flowing through each resonator is the same. On the other hand, in the resonant circuit 221 of the filter device 220, the vias connected to the reference potential are alternately arranged as vias V21A, V22, and V23A, and the orientation of current flowing through the resonator RC72 is opposite to the orientation of current flowing through the resonators RC71 and RC73. As for the arrangement of the vias connected to the reference potential, they are set as appropriate in accordance with the target frequency bandwidth.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a multilayer body including a plurality of dielectric layers laminated together;
an unbalanced terminal;
a first balanced terminal and a second balanced terminal;
a first resonant circuit connected to the unbalanced terminal; and
a second resonant circuit connected to the first balanced terminal and the second balanced terminal and electromagnetically coupled with the first resonant circuit; wherein
the first resonant circuit includes a first resonator in which a first inductor and a first capacitor are connected in parallel between the unbalanced terminal and a reference potential;
the second resonant circuit includes a second resonator including a second inductor connected between the first balanced terminal and the second balanced terminal and a second capacitor and a third capacitor connected in series between the first balanced terminal and the second balanced terminal;
the plurality of dielectric layers include a first layer;

the first inductor includes a first wiring electrode provided on the first layer and a first conductor and a second conductor connected to the first wiring electrode and extending in a laminating direction of the multilayer body;

the second inductor includes a second wiring electrode on the first layer and a third conductor and a fourth conductor connected to the second wiring electrode and extending in the laminating direction of the multilayer; and the second wiring electrode has a line length longer than a line length of the first wiring electrode.

2. The filter device according to claim 1, further comprising a coupling electrode to provide capacitive coupling between the first wiring electrode and the second wiring electrode.

3. The filter device according to claim 1, wherein the second wiring electrode includes a path extending from connection points with the third conductor and the fourth conductor in a direction away from the first resonant circuit, when viewed in plan view from the laminating direction of the multilayer body.

4. The filter device according to claim 1, wherein the second wiring electrode includes a path extending from connection points with the third conductor and the fourth conductor in a direction toward the first resonant circuit, when viewed in plan view from the laminating direction of the multilayer body.

5. The filter device according to claim 1, wherein a space between the third conductor and the fourth conductor is wider than a space between the first conductor and the second conductor.

6. The filter device according to claim 1, wherein
the third conductor and the fourth conductor are equal in length; and
the filter device further includes a power feeding terminal connected to a center portion on the second wiring electrode.

7. The filter device according to claim 1, wherein the first conductor and the second conductor include side electrodes on side surfaces of the multilayer body.

8. The filter device according to claim 1, wherein the third conductor and the fourth conductor include side electrodes on side surfaces of the multilayer body.

9. The filter device according to claim 1, wherein the first conductor to the fourth conductor include vias.

10. The filter device according to claim 1, wherein
each of the first resonant circuit and the second resonant circuit includes at least one LC parallel resonator;
the at least one LC parallel resonator includes a conductor extending in the laminating direction of the multilayer body; and
the conductor in at least one in the at least one LC parallel resonator includes a side electrode on a side surface of the multilayer body.

11. The filter device according to claim 1, wherein a connection node between the second capacitor and the third capacitor is connected to the reference potential.

12. The filter device according to claim 2, wherein the coupling electrode overlaps at least a portion of the first wiring electrode and at least a portion of the second wiring electrode, when viewed in plan view from the laminating direction of the multilayer body.

13. The filter device according to claim 1, wherein the filter device is a balanced filter to convert unbalanced signals to balanced signals.

14. The filter device according to claim 1, wherein the filter device is a diplexer.

15. A multiplexer comprising:
a first terminal;
a first filter device connected to the first terminal via an inductor; and
a second filter device connected to the first terminal via a capacitor; wherein
at least one of the first filter device and the second filter device is the filter device according to claim 1.

16. A multiplexer comprising:
a first terminal;
a first filter device connected to the first terminal via an inductor; and
a second filter device connected to the first terminal via a capacitor; wherein
each of the first filter device and the second filter device is the filter device according to claim 1.

* * * * *